United States Patent
Wang et al.

[11] Patent Number: 5,977,626
[45] Date of Patent: Nov. 2, 1999

[54] THERMALLY AND ELECTRICALLY ENHANCED PBGA PACKAGE

[75] Inventors: Hsing-Seng Wang, Chung Li; Rong-Shen Lee, Hsinchu; Pou-Huang Chen, Chang Hua, all of Taiwan

[73] Assignee: Industrial Technology Research Institute, Hsinchu Hsien, Taiwan

[21] Appl. No.: 09/133,483

[22] Filed: Aug. 12, 1998

[51] Int. Cl.⁶ ............................ H01L 23/10; H01L 23/34
[52] U.S. Cl. ........................... 257/707; 257/706; 257/691
[58] Field of Search .................................. 257/787, 796, 257/706, 707, 718, 778, 719, 691

[56] References Cited

U.S. PATENT DOCUMENTS

| | | |
|---|---|---|
| 4,692,791 | 9/1987 | Bayraktaroglu . |
| 5,311,059 | 5/1994 | Banerji et al. . |
| 5,371,404 | 12/1994 | Juskey et al. ............................ 257/787 |

*Primary Examiner*—Sheila V. Clark
*Attorney, Agent, or Firm*—McDermott, Will & Emery

[57] ABSTRACT

The present invention includes a substrate having a die adhered thereon. The die and the substrate are interconnected by means of signal transferring means. Solder bumps are formed on the bottom side surface of the substrate. Molding compound is encapsulated among the substrate, the die and a heat spreader. A heat spreader is arranged over the top surface of the substrate. The heat spreader includes a plane having four supporting members that are set on the bottom side of the plane and at the corners of the plane. The supporting members are protruded from the plane to connect the heat spreaders and the substrate. The heat spreader further includes a protruded portion. A further supporting member is formed on the central portion of the protruded portion. The substrate has a die paddle formed thereon for receiving the die. A power ring is formed around the die paddle on the surface of the substrate for power input. A ground ring formed around the power ring on the substrate has ground pads. The supporting members of the heat spreader are connected on the ground pads by using the heat spreader attach material.

28 Claims, 4 Drawing Sheets

THERMALLY AND ELECTRICALLY ENHANCED PBGA PACKAGE

FIELD OF THE INVENTION

The present invention relates to an electronic device such as a semiconductor package and particular to high performance package with enhanced capability of spreading heat and electrical performance.

BACKGROUND OF THE INVENTION

In recent years, since the circuit devices in a chip are manufactured with a high density and it has been a trend to make semiconductor devices having small size. IC (integrated circuits) designers are continuously tempted to scale down the size of each device and increase chip level integration in per unit area. Typically, the semiconductor devices require protection from moisture and mechanical damage. The protection is provided by a package having electrical conductive means to transfer signal between the chip and the external circuits. The renewed interest in high density hybrid is driven by the requirement to handle large numbers of IC interconnections, the increasing clock rate of digital systems and the desire to pack greater functionality into smaller spaces. Therefore, the number of a package's leads becomes more and more. An important consideration in making small, high speed and high-density devices is providing packages capable of the spreading heat generated by the devices. A further problem confronting the technology is the relentless need for more I/O per chip. Those issues lead to the requirement of more power for devices and the reduction of impedance of inductance. A conventional lead frame package has a limitation to increase the number of the package's lead.

FIG. 1 shows a conventional package which includes a substrate 2, a die 4 formed on the substrate via die attach epoxy 6. The die is electrically connected to the substrate 2 by using gold wire bonds 8. Solder balls 10 for signal transfer is formed on the bottom surface of the substrate 2. Molding compound 12 is used to cover the die 4 and gold wire bonds 8 for protection. The heat is spread by using thermal vias 14 formed in the substrate 2 and thermal balls 16 connected to the thermal vias 14. However, the amount heat generated by devices is increased due to the packing density is increased. This also causes the conventional package can not meet the requirement of the future demands.

As the semiconductor production continuously grows, more types of package are developed. One of the notable is the plastic molded package, such as described in U.S. Pat. No. 5,586,010. Another type of package is disclosed in U.S. Pat. No. 5,629,835 to Mahulikar et al., entitled "METAL BALL GRID ARRAY PACKAGE WITH IMPROVED THERMAL CONDUCTIVITY".

VLSI integrated circuits packages having high connection capacity are pin grid array (PGA) and ball grid array (BGA). One such package type is plastic ball grid array (PBGA). The PBGA offers many advantages over conventional packages such as solder ball I/O and high speed. The PBGA package has high speed due to a short path for signal transformation. The solder balls are set on a package surface in a matrix array which can provide more signal contacts.

In order to solve the problem relating to spread heat, pad array semiconductor devices have been proposed (see U.S. Pat. No. 5,285,352). The structure uses a thermal conductor in a pad array device permits routing of conductive traces and terminals beneath a semiconductor die for improved utilization of substrate area. An opening and a thermal conductor are set under the die on a substrate. The heat that is generated by devices is dissipated to computer board via silver epoxy, the opening and a metal ground plane.

The efficiency of spreading heat of the conventional structure is poor. The electrical magnetic (EM) shielding of the prior art is also not good. Thus, what is required is an improved package with good efficiency of spreading heat and EM shielding.

SUMMARY OF THE INVENTION

An object of the present invention is to provide a package with good efficiency of spreading heat and enhanced EM shielding.

The package includes a substrate. A semiconductor chip or die is fixedly adhered to the substrate by means of die attach material such as die attach epoxy. The die and the substrate are interconnected by means of signal transferring means such as bounding (gold)wires, solder ball or tape having conductive pins. Ball grid array (BGA), preferably, solder bumps (balls), are formed on the bottom side surface of the substrate. The solder bumps are used for external electrically coupling to the chip. At an end of each conductive trace in the substrate is connected to the solder bumps. Solder bumps are terminal of a device which permit electrical signal transfer to the chip. In the present invention, molding compound is encapsulated among the substrate, the die and a heat spreader. A heat spreader or heat slug is arranged over the top surface of the substrate. The heat spreader includes a plane having a plurality of, preferably four supporting members that are set on the bottom side of the plane and at the corners of the plane. The supporting members are protruded from the plane to connect the heat spreaders and the substrate. The heat spreader further includes a protruded portion that is shaped to prevent the heat spreader from contacting with the die and the bounding wires. A further supporting member is formed on the central portion of the protruded portion. The supporting member can be optionally made to contact to the die or not. The substrate has a die paddle formed thereon for receiving the die. A power ring is formed around the die paddle on the surface of the substrate for power input. A ground ring formed around the power ring on the substrate has ground pads. The supporting members of the heat spreader are connected on the ground pads by using the heat spreader attach material.

DETAILED DESCRIPTION OF THE PREFERRED EMBODIMENT

Figure 1:
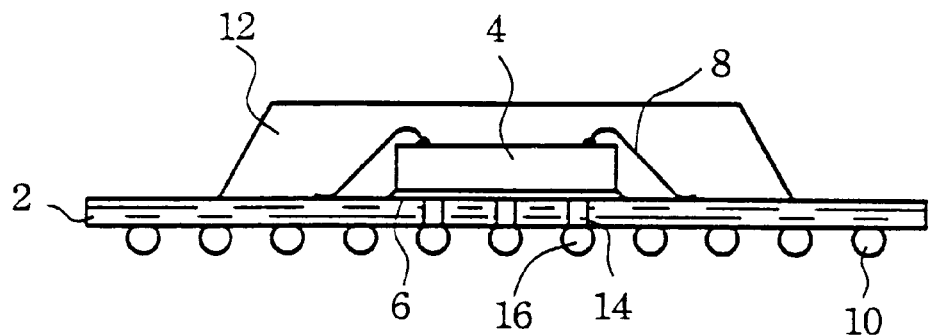
FIG. 1 is a cross sectional view of a structure of a package in accordance with the prior art.
Figure 2:
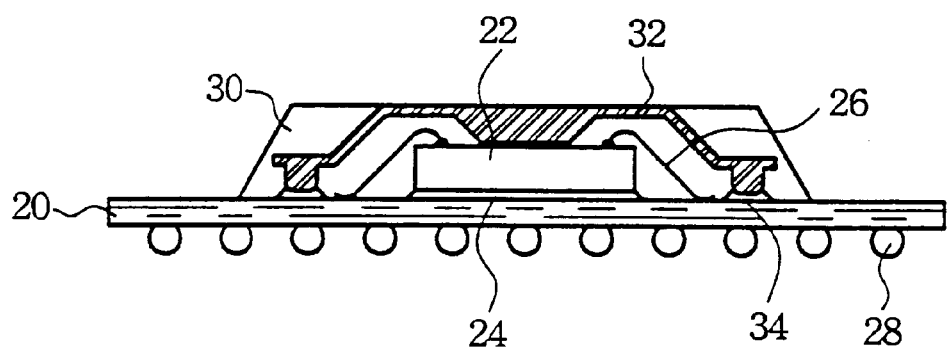
FIG. 2 is a cross sectional view of a package in accordance with a first embodiment of the present invention.
Figure 3:
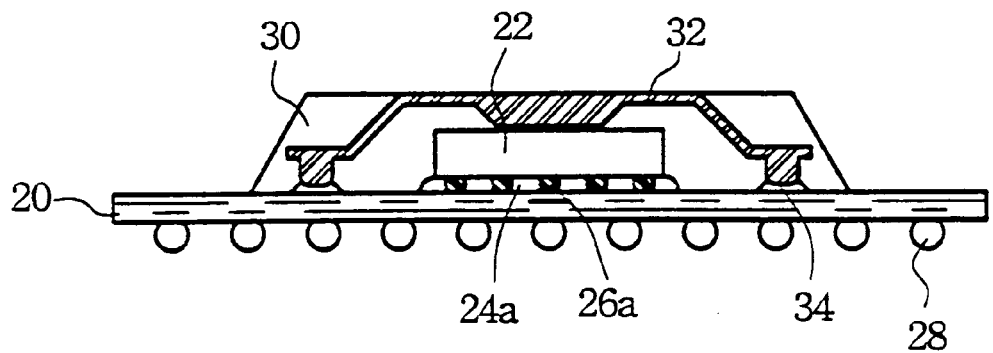
FIG. 3 is a cross sectional view of a package in accordance with a second embodiment of the present invention.
Figure 4:
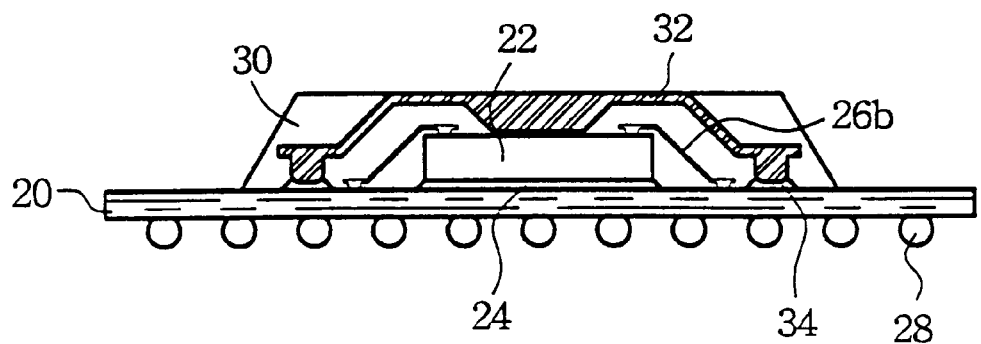
FIG. 4 is a cross sectional view of a package in accordance with a third embodiment of the present invention.

The present invention discloses a structure of a semiconductor package for improving the efficiency of spreading heat and EM shielding. FIGS. 2–4 are cross section views of the embodiments according to the present invention. FIG. 2 illustrates a first embodiment of the present invention. As shown therein, the package 10 includes a substrate 20. A semiconductor chip or die 22 is fixedly adhered to the substrate 20 by means of die attach material such as die attach epoxy 24. The substrate has a first major surface and a second major surface. The first major surface is referred to a top side surface of substrate and the second major surface is referred to a bottom side surface of the substrate. In the preferred embodiment, the substrate 20 includes a plurality of conductive traces (not shown), such as flexible printed circuit (PC) formed therein. The conductive traces of the substrate 20 are used to provide electrical conductive path for signal transfer. The material used for the substrate can be a kind of dielectric, for example, polyimide, phenolic resin or bismaleimidetriazine (BT). Of course, any suitable material can be used for acting as the substrate. The conductive trace can be selected from gold, copper or conductive metal or alloy.

Figure 6:
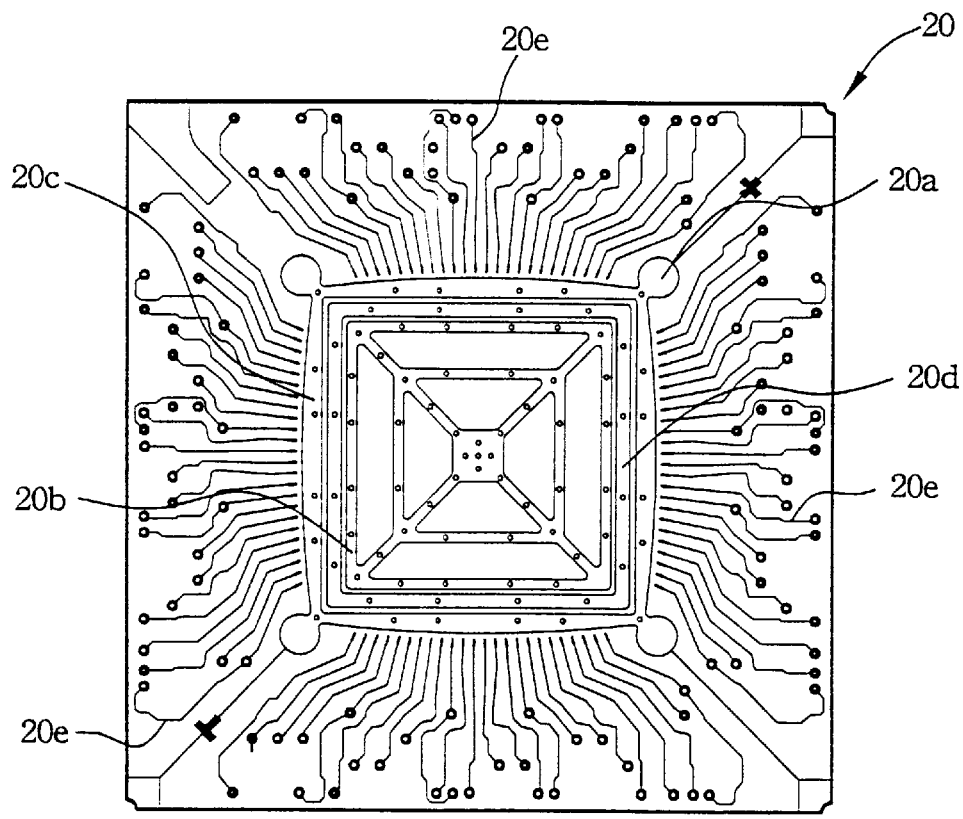
FIG. 6 is a top view of the substrate in accordance with the present invention.

Still turning to FIG. 2, the chip (die) 22 and the substrate 20 are interconnected by means of signal transferring means such as bounding wires 26. For example, gold wires. Actually, the die 22 is connected to the conductive traces in the substrate 20. Using conventional wire bonding techniques, the chip 22 is coupled to the conductive traces. As aforesaid, the conductive traces are in the substrate for providing electrical connection path. One end of the bonding wire is connected to the chip 22 via a conductive pad array formed thereon, another end of the bonding wire 26 is connected to a BGA array 28 formed on the bottom side surface (second major surface) of the substrate 20 via the conductive traces 20e (FIG. 6).

Ball grid array (BGA), preferably, solder bumps (balls) 28, are formed on the bottom side surface of the substrate 20 by conventional positioning technique and using a solder re-flow operation. The solder bumps 28 are used for electrically coupling to the chip 22. It is appreciate that metal alloy can be used to act the solder bumps 28. Typically, at an end of each conductive trace in the substrate 20 is connected to the solder bumps 28 Solder bumps 28 are terminal of a device which permit electrical signal transfer to the chip 22. In general, the solder bumps 28 are arranged in a matrix array configuration.

In the present invention, the space among the substrate 20, the chip 22 and a heat spreader 32 is encapsulated by molding material (compound) 30 using encapsulating technique. Thus, the bonding wires 20 are electrically isolated by the encapsulating material 30. The heat spreader or heat slug 32 is arranged over the top surface (first major surface) of the substrate 20 by using adhesive material 34. For example, heat spreader attach epoxy can be used to achieve the purpose. Preferably, the heat spreader is exposed by the molding compound 30. This portion can improve the efficiency of spreading heat. General speaking, the chip 22 generates a lot of heat during operation. The heat spreader 32 promotes thermal generated by the chip 22 away from the chip 22. Typically, the heat spreader is formed of a kind of metal or alloy that has low thermal resistance.

Figure 5:
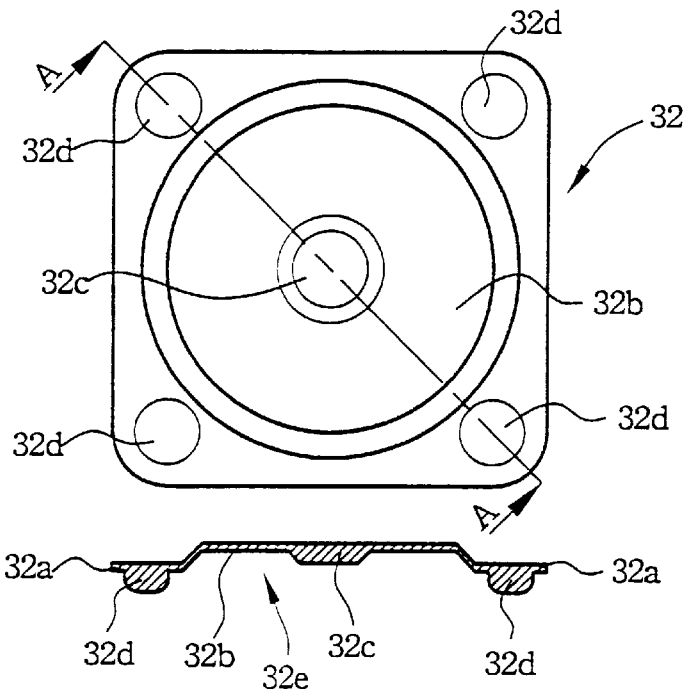
FIG. 5 is a top view and a side view of a head slug in accordance with the present invention.

As shown in FIG. 5, the scheme illustrates the top view and the side view of the heat spreader 32 of the present invention. The heat spreader 32 includes a plane 32a having a plurality of, preferably four supporting members 32d that are set on the bottom of the plane 32a and at the corners of the plane 32a. The supporting members 32d are protruded from the plane 32a. The supporting members 32d are used to connect the ground pad 20a to the substrate 20. More detail, the supporting members 32d and the substrate 20 are connected by means of heat spreader attaching material. In a case, epoxy or conductive glue can serve as the material to obtain the object. The heat spreader 32 further includes a protruded portion 32b that is shaped to prevent the heat spreader 32 from contacting with the die 22 and the bonding wires 8, thereby forming a cavity 32e therein. The die 22 is formed within the cavity 32e. A further supporting member 32c is formed on the central portion of the protruded portion 32b and in the cavity 32e. The supporting member 32c can be optionally made to contact to the chip 22 or not.

Turning to the FIG. 6, it shows the top view of the substrate 20. The substrate has a die paddle 20b formed thereon for receiving the die 22. A power ring is formed around the die paddle 20b on the surface of the substrate 20 for power input. A ground ring 20c formed around the power ring 20d on the substrate has ground pads 20a. The supporting members 32d of the heat spreader 32 are connected on the ground pads 20a by using the heat spreader attach material 34. The present invention features the advantage of that the ground ring 20c and the heat spreader 32 construct a electric and. magnetic (EM) shielding to suppress the EM effect. This structure can reduce the inductance impedance. In the preferred embodiment, the ground pads 20a are aligned to the supporting members 32d. The heat is directly spread by the heat spreader 32. Additionally, the head spreader 32 is connected to the ground ring 20c of the substrate 20. Therefore, the efficiency of spreading heat is improved. The present invention exhibits short signal transferring path. Further, it can improve the EM shielding effect.

FIG. 3 is a cross-sectional view of a second embodiment of the present invention. Since, in FIG. 3, like reference numerals are each assigned to the portions each corresponding to those of the first embodiment, any detailed and repeated description is omitted. In this embodiment, a ball grid array (BGA), preferably, solder bumps (balls) 26a are used as the signal transferring means in lieu of the bonding wires 26 in the first embodiment. Thus, compound (under fill) 24a is used to take place of the die attach material 24 in FIG. 2 for filling under the die 22 and among the solder bumps 26a, substrate 20, the die 22. FIG. 4 is a third embodiment of the present invention, only the signal transferring means is different from the first embodiment. In the embodiment, a conductive tape 26b is employed to serve as the signal transferring means.

FIG. 7A to FIG. 7F are partial, cross-sectional views showing the assembling process in accordance with the present invention. First, in FIG. 7A, the die attach epoxy 24 is applied on the die paddle 20b of the substrate 20. The semiconductor chip or die 22 is loaded on the die paddle 20b. A heat treatment is used at the temperature of about 145 to 150 degrees Centigrade to fixedly adhere the die 22 to the substrate 20.

Figure 7A:
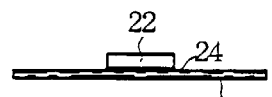
FIGS. 7A–7F shows the automatic setup process in accordance with the present invention.
Figure 7B:
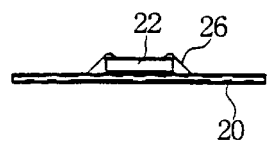

Then, as shown in FIG. 7B, the die 22 and the substrate 20 are interconnected with the bounding wires 26 made of gold wire at the heating temperature of about 170 to 175 degrees Centigrade.

Figure 7C:
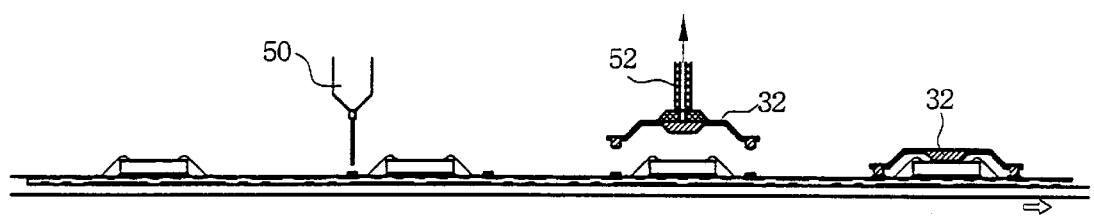

Turning to FIG. 7C, epoxy or conductive glue is arranged on the ground pad 20a of the substrate 20 by using auto dispenser 50. Then, the heat spreader 32 is drop on the substrate and aligned the ground pad 20a to the supporting member 32d by using auto vacuum pick and place apparatus. Then, a thermal curing is performed at the temperature about 145 to 150 degrees Centigrade.

Figure 7D:

Then, as shown in FIG. 7D, the molding compound 30 is formed over the die 22 and the heat spreader 32 for protection.

Figure 7E:
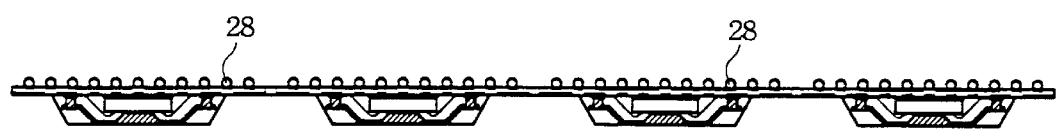
Figure 7F:

Referring to FIG. 7E, the package is turn up side down for implanting solder balls 28 on the surface of the substrate 20. The result of the assembling process is shown in FIG. 7F.

As is understood by a person skilled in the art, the foregoing preferred embodiments of the present invention are illustrated of the present invention rather than limiting of the present invention. It is intended to cover various modifications and similar arrangements included within the spirit and scope of the appended claims, the scope of which should be accorded the broadest interpretation so as to encompass all such modifications and similar structure. Thus, while the preferred embodiment of the invention has been illustrated and described, it will be appreciated that various changes can be made therein without departing from the spirit and scope of the invention.

The embodiments of the invention in which an exclusive property or privilege is claimed are defined as follows:

1. A semiconductor package, said package comprising:
    a substrate having a die paddle for receiving a die adhered thereon, a ground ring formed around said die paddle, wherein said ground ring has ground pads;
    a heat spreader having supporting members formed over on said substrate and said die, said supporting members being connected to said ground pads;
    signal transferring means for electrically connecting between said substrate and said die, said heat spreader comprising a plane, wherein said supporting members are set on a bottom surface and at corners of said plane, a protruded portion shaped to prevent said heat spreader from contacting with said die and said signal transferring means;
    encapsulating material filling among said substrate, said die, and said heat spreader; and
    a first ball grid array (BGA) formed on a bottom surface of said substrate.

2. The package of claim 1, wherein said supporting members are connected to said ground pads by means of conductive glue.

3. The package of claim 1, wherein said signal transferring means comprises bonding wires.

4. The package of claim 3, wherein said bonding wires include gold wires.

5. The package of claim 1, wherein said signal transferring means comprises conductive tape.

6. The package of claim 1, wherein said signal transferring means comprises a second ball grid array (BGA).

7. A semiconductor package, said package comprising:
    a substrate having ground pads;
    a die adhered on said substrate;
    a heat spreader having supporting members formed over on said substrate and said die by means for said supporting members connecting to said ground pads;
    signal transferring means for electrically connecting between said substrate and said die, said heat spreader comprising a plane, wherein said supporting members are set on a bottom surface and at corners of said plane, a protruded portion shaped to prevent said heat spreader from contacting with said die and said signal transferring means;
    encapsulating material filling among said substrate, said die, and said heat spreader; and
    a first ball grid array (BGA) formed on a bottom surface of said substrate.

8. The package of claim 7, wherein said supporting members are connected to said ground pads by means of conductive glue.

9. The package of claim 7, wherein said signal transferring means comprises bonding wires.

10. The package of claim 9, wherein said bonding wires include gold wires.

11. The package of claim 7, wherein said signal transferring means comprises conductive tape.

12. The package of claim 7, wherein said signal transferring means comprises a second ball grid array (BGA).

13. The package of claim 7, wherein said substrate further includes a ground ring formed around said die paddle, wherein said ground pads are connected to said ground ring.

14. A semiconductor package, said package comprising:
    a substrate having a die paddle for receiving a die adhered thereon, a ground ring formed around said die paddle, wherein said ground ring has ground pads;
    signal transferring means for electrically connecting between said substrate and said die;
    a heat spreader having first supporting members formed over on said substrate and said die, said first supporting members being connected to said ground pads, said heat spreader comprising a plane, wherein said first supporting members are set on a bottom surface and at corners of said plane, a protruded portion shaped to prevent said heat spreader from contacting with said signal transferring means, a second supporting member formed on a central portion of said protruded portion;
    encapsulating material filling among said substrate, said die, and said heat spreader; and
    a first ball grid array (BGA) formed on a bottom surface of said substrate.

15. The package of claim 14, wherein said supporting members are connected to said ground pads by means of conductive glue.

16. The package of claim 14, wherein said signal transferring means comprises bonding wires.

17. The package of claim 16, wherein said bonding wires include gold wires.

18. The package of claim 14, wherein said signal transferring means comprises conductive tape.

19. The package of claim 14, wherein said signal transferring means comprises a second ball grid array (BGA).

20. A semiconductor package, said package comprising:
    a substrate having ground pads;
    a die adhered on said substrate;
    signal transferring means for electrically connecting between said substrate and said die;
    a heat spreader having first supporting members formed over on said substrate and said die by means of said first supporting members connecting to said ground pads, said heat spreader comprising a plane, wherein said first supporting members are set on a bottom surface and at corners of said plane, a protruded portion shaped to prevent said heat spreader from contacting with said signal transferring means, a second supporting member formed on a central portion of said protruded portions;
    encapsulating material filling among said substrate, said die, and said heat spreader; and
    a first ball grid array (BGA) formed on a bottom surface of said substrate.

21. The package of claim 20, wherein said supporting members are connected to said ground pads by means of conductive glue.

22. The package of claim 20, wherein said signal transferring means comprises bonding wires.

23. The package of claim 22, wherein said bonding wires include gold wires.

24. The package of claim 20, wherein said signal transferring means comprises conductive tape.

25. The package of claim 20, wherein said signal transferring means comprises a second ball grid array (BGA).

26. The package of claim 20, wherein said substrate further includes a ground ring formed around said die paddle, wherein said ground pads are connected to said ground ring.

27. A semiconductor package, said package comprising:

a substrate having a die adhered thereon, a ground ring formed around said die paddle, wherein said ground ring has ground pads;

signal transferring means for electrically connecting between said substrate and said die;

a heat spreader having first supporting members formed over on said substrate and said die, said first supporting members being connected to said ground pads, said heat spreader comprising a plane, wherein said first supporting members are set on a bottom surface and at corners of said plane, a protruded portion shaped to prevent said heat spreader from contacting with said signal transferring means, wherein said ground ring and said heat spreader construct an electric and magnetic (EM) shielding to suppress the EM effect and reduce the I inductance impedance;

encapsulating material filling among said substrate, said die, and said heat spreader; and a first ball grid array (BGA) formed on a bottom surface of said substrate.

28. The package of claim 27, wherein said substrate further includes a second supporting member formed on a central portion of said protruded portion.

* * * * *